(12) United States Patent
Ludwig

(10) Patent No.: US 8,174,834 B2
(45) Date of Patent: May 8, 2012

(54) MOLDED HOUSING USED IN FORCE FIT METHOD

(75) Inventor: Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 628 days.

(21) Appl. No.: 12/161,399

(22) PCT Filed: Jul. 9, 2007

(86) PCT No.: PCT/EP2007/056966
§ 371 (c)(1),
(2), (4) Date: Jul. 18, 2008

(87) PCT Pub. No.: WO2008/017556
PCT Pub. Date: Feb. 14, 2008

(65) Prior Publication Data
US 2010/0282507 A1    Nov. 11, 2010

(30) Foreign Application Priority Data

Aug. 11, 2006    (DE) .......................... 10 2006 037 691

(51) Int. Cl.
*H05K 7/00*    (2006.01)
(52) U.S. Cl. ........................................ 361/728

(58) Field of Classification Search .......... 361/761–764, 361/783, 735, 813, 820; 174/260, 520
See application file for complete search history.

(56) References Cited

U.S. PATENT DOCUMENTS

| 4,646,203 | A | 2/1987 | Ngo et al. |
| 4,975,671 | A * | 12/1990 | Dirks .............................. 336/65 |
| 5,498,902 | A | 3/1996 | Hara |
| 2006/0151872 | A1 | 7/2006 | Lenniger |
| 2007/0066139 | A1 * | 3/2007 | Roeper et al. .................. 439/607 |

FOREIGN PATENT DOCUMENTS

| DE | 197 44 297 | 4/1999 |
| DE | 103 29 102 | 1/2005 |
| JP | 4-30561 | 2/1992 |

OTHER PUBLICATIONS

Force-Fit Methods: Expertise: Force-Fitting Technology, Internet Article (Online) Apr. 20, 2006 (With Certified English Translation).

* cited by examiner

*Primary Examiner* — Jeremy Norris
*Assistant Examiner* — Tremesha S Willis
(74) *Attorney, Agent, or Firm* — Michael J. Striker

(57) ABSTRACT

A molded housing for an electronic circuit, for installation in electronic devices and/or sensors or pick-ups includes at least one force-fit zone, and a force-fit component assigned each of said at least one force-fit zone. The force-fit component is mounted by welding on a die pad of the molded housing.

20 Claims, 4 Drawing Sheets

MOLDED HOUSING USED IN FORCE FIT METHOD

CROSS-REFERENCE

The invention described and claimed hereinbelow is also described in PCT/EP2007/056966, filed on Jul. 9, 2007 and DE 102006037691.9, filed Aug. 11, 2006. This German Patent Application, whose subject matter is incorporated here by reference, provides the basis for a claim of priority of invention under 35 U.S.C. 119 (a)-(d).

BACKGROUND OF THE INVENTION

The present invention relates to a molded housing for an electronic circuit.

Molded housings for accommodating electronic circuits are known. They are used, in particular, as chip housings, e.g., for accommodating sensor chips or the similar circuits. Their advantage is that they completely encapsulate the circuit integrated inside. The common feature of the housing designs known from the related art is that they are contacted via leads that extend laterally out of the housing. Via these leads, the chip housing is mounted on and/or contacted to a printed circuit board or a substrate using a soldering process. The disadvantage of these known designs is that the mounting and/or contacting to the printed circuit board or a substrate must take place via the leads, which requires laborious assembly steps which are complicated to control and are prone to error. Assembly steps of this type are also very costly. The current design and the resultant assembly expense are disadvantageous especially for molded housings that require very few electrical contacts (e.g., sensor chips).

SUMMARY OF THE INVENTION

The object of the present invention is to provide a molded housing for electronic circuits that avoids the disadvantages stated above.

To this end, a molded housing—that includes force-fit zones—for an electronic circuit is provided for installation in electronic devices and/or applications, in particular sensors or pick-ups. Force-fit zones are primarily regions in/on the molded housing that are designed, in the broadest sense, for the application of force-fitting techniques. "Force-fitting techniques" refer to any type of installation that involves a cold connection of at least two components using a compression force.

According to a preferred embodiment of the present invention, it is provided that the force-fit zones are designed as electrical contact points. The electrical contacting of the electrical/electronic circuit provided in the molded housing therefore takes place in the force-fit zones.

According to a particularly preferred embodiment of the present invention, it is provided that the force-fit zones are designed as redundant electrical contact points. This means that a larger number of electrical contact points exist on the molded housing than are required for the proper contacting of the electrical/electronic circuit located in the molded housing. When the molded housing is installed, there is a choice as to whether one or the other electrical contact point is used for contacting. A great deal of freedom regarding the assembly procedure is attained as a result.

According to a further preferred embodiment of the present invention, it is provided that the force-fit zones are designed as mechanical fixing devices. The force-fit zones therefore also serve to fix the molded housing in position when it is installed in the aforementioned electronic devices and/or applications. The molded housing requires no further attachment, e.g., via screwed connections or soldering. It is also possible, of course, for the force-fit zones to be designed as electrical contact points or as mechanical fixing devices, thereby performing both functions. Especially when redundant electrical contact points are used, it is immediately possible to use a portion of the force-fit zones for electrical contacting, and to use another part solely to mechanically fix the molded housing in position in the application.

According to an embodiment of the present invention, it is provided that the force-fit zones have an essentially circular cross section. A cross section of this type makes it possible to easily provide electrical contacting as well as mechanical fixing, since this type of cross section ensures that exact positioning will be attained on both sides.

According to a further preferred embodiment of the present invention, it is provided that the force-fit zones are designed as recesses in the molded housing that are shaped essentially as truncated cones. "Essentially as truncated cones" means that the force-fit zones have a larger circular cross section on an outside of the molded housing (surface region) than further toward the center or the underside of the molded housing. In this manner, a specific orientation is ensured when related fixing or contacting means are used in the region of the force-fit zones. A very good manner of fixing components in position is simultaneously attained.

In a further embodiment of the present invention, it is provided that the molded housing includes a positioning device. A positioning device is any type of device that is suitable for defining the position of the molded housing relative to a certain reference plane or a certain reference point, preferably in a mechanical manner. For example, a positioning device may be designed as a projection or a recess.

According to a preferred embodiment, it is provided that the force-fit zones are located such that they are symmetrical. This means that the force-fit zones on the molded housing are designed such that they are designed symmetrical or at least essentially symmetrical with each other. They have the same distances or similar angles, e.g., from a certain point on the molded housing and relative to each other.

According to a further preferred embodiment, it is provided that the force-fit zones are located such that they are symmetrical to the positioning device. In this manner, it is ensured that the molded housing may be used in many different configurations, it being possible to determine the use, e.g., via the positioning device. For acceleration sensors that sense in a certain direction, it is possible, e.g., to realize an x-sensor or a y-sensor with the same molded housing, the different sensing directions being realized by using the positioning device for installation in a position that is rotated by 90 degrees. The force-fit zones, preferably electrically redundant force-fit zones, are then contacted in the necessary manner.

In a further embodiment it is provided that the contact points are contactable from a top side or from an underside of the molded housing. A contacting may therefore take place from the top side or from the underside of the molded housing, in which case the top-side contact is not necessarily the same as the underside contact. When the top-side contacts and the underside contacts are the same, a degree of freedom is attained in terms of the type of contacting to use. When the top-side contacts and the underside contacts are not the same (i.e., when different contacts result), the effective number of contacts may be increased.

According to a further preferred embodiment of the present invention, it is provided that the force-fit zones include holes.

Via these holes, a further degree of freedom is attained in terms of fastening and/or electrical contacting, by using devices that extend through the molded housing.

In an embodiment of the present invention, it is provided that the molded housing is a standard molded housing, e.g., a standard Plastic Quad Flat Pack (PQFP), as is already known from the related art. It has no leads or only very short leads. When the contacting takes place exclusively via the aforementioned contact points in the force-fit zones, the use of leads—which are required for installation on printed circuit boards—becomes superfluous. The leads are therefore eliminated, or, if assembly is performed on conventional production lines, they are located far from the housing. If a further contacting via leads is desired for a certain application, however, leads may be left on the mold housing with the required length and in the required number.

In a further embodiment, it is provided that a force-fit component is assigned to the force fit zone, which is mounted on a die pad of the molded housing, in particularly being welded thereon. The aforementioned force-fit zone therefore corresponds to a force-fit component that is mounted on a die-pad, being welded thereon, in particular, as an electrical connection or as an electrical component inside the molded housing. The force-fit component is a metallic part to be inserted, in particular, which establishes the electrical connection with the circuits located in the molded housing and possibly further components as well. After the particular circuit is installed on the typical lead frame and they are contacted with each other, e.g., via wire bonds, a coating is applied around the housing via injection-molding with a mold compound.

In a preferred embodiment, it is therefore provided that the die pad includes receiving zones for the force-fit components. The force-fit components are therefore accommodated in a certain spacial configuration in the molded housing.

In a further embodiment, it is provided that the die pad includes a receiving structure for orienting and/or fixing the force-fit components in position. The force-fit components are therefore oriented and/or fixed in position on the die pad before the actual attachment process (e.g., welding), thereby simplifying the further assembly.

The present invention also includes an electronic module, in particular an acceleration sensor, in particular for automotive technology, with a molded housing as recited in one of the preceding claims. As described above, when redundant electrical contact points are used and force-fit zones are used as mechanical fixing devices, preferably in conjunction with a positioning device, it is possible to create molded housings in various orientations using the same basic element as the component. For example, an acceleration sensor may be presented in the x-direction or the y-direction, in which case only one sensing direction is required, and only the molded housing that includes the acceleration sensor itself is rotated by 90 degrees. This may be achieved, advantageously, using the positioning device. The installation and stockpiling of components is made dramatically simpler and less expensive as a result.

In a further preferred embodiment, it is provided that the molded housing is electrically contacted in the electronic module that includes a cavity using at least two force-fit pins that correspond to the force-fit zones. The electrical contacting therefore takes place via force-fit pins, e.g., essentially rod-shaped designs inside a cavity in the electronic module that correspond with the force-fit zones of the molded housing and enter in electrical contact therewith as soon as the molded housing is placed in the electronic module. No further electronic contacting, e.g., via lead pins and printed circuit boards, is required.

According to a particularly preferred embodiment, it is provided that the force-fit pins are designed as a mechanical fixing device. The force-fit pins described above serve to establish electrical contacts, and therefore also serve as a mechanical fastening device for the molded housing inside the electronic module.

According to a further embodiment, it is provided that the electronic module includes force-fit pins that are designed exclusively as a fastening device, but not as a contacting device. Further force-fit pins therefore exist inside the cavity of the electronic module, which do not serve as electrical contacts for the mold housing, but which rather (e.g., when redundant force-fit zones exist) solely perform a fastening function for the molded housing inside the electronic module. This takes place, e.g., in that the force-fit pins have no type of electrical contacting with other force-fit pins or other contact points.

According to a further preferred embodiment, it is provided that the electronic module includes a position-determining device. A position-determining device refers to a device that is preferably located in the cavity of the electronic module, which, in conjunction with the positioning device on the molded housing, enables the molded housing to be oriented spacially inside the electronic module. The combination of positioning device/position-determining device is preferably selected such that an unambiguous positioning that cannot be confused is attainable, preferably automatically. This takes place in particular by using corresponding recesses and projections.

BRIEF DESCRIPTION OF THE DRAWINGS

The present invention is explained below in greater detail below with reference to the drawing.

DETAILED DESCRIPTION OF THE PREFERRED EMBODIMENTS

Figure 1:
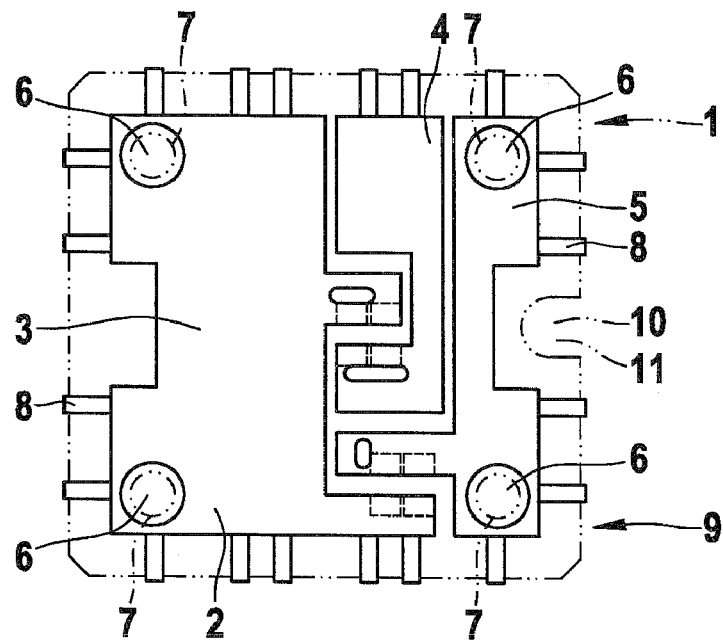
FIG. 1 shows a structured die pad with a molded housing.

FIG. 1 shows a molded housing 1 for an electronic circuit for installation in electronic devices and/or applications. Molded housing 1 includes a structured die pad 2, which is shown here as an example of any application, and which may have any design, depending on the particular application. In the current example, die pad 2 is subdivided into three components, i.e., a first die pad component 3, a second die pad component 4, and a third die pad component 5. First die pad component 3 includes holes 6 for the subsequent formation of a force-fit zone 7. The same applies for third die pad component 5, which also includes holes 6. Shortened leads 8 are assigned to the die pad, which are produced using the typical manufacturing method using a not-shown lead frame, and which are capped directly on outer edges 9 of molded housing 1. Molded housing 1 also includes a positioning device 10, which is designed as an edge recess 11 in molded housing 1.

Figure 2:
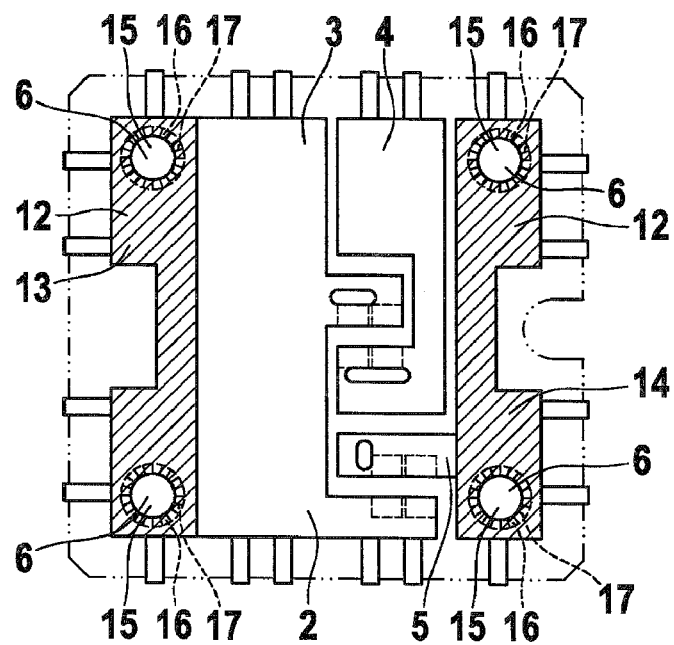
FIG. 2 shows the same die pad with force-fit components.

FIG. 2 shows the molded housing in FIG. 1, although elements described in that context that are not required for the further explanation are left out of FIG. 2, for clarity. Force-fit components 12 are assigned to holes 6 of structured die pad 2, i.e., a first force-fit component 13 is assigned to first die pad component 3, and a second force-fit component 14 is assigned to third die pad component 5. Force-fit components 12 include punched-out areas 15 (although they need not be manufactured using a punching process, of course, but using any other type of penetrating method). Punched-out areas 15 have a smaller cross section than holes 6, thereby resulting in an overlap zone 16. In the region of these overlap zones 16, a portion of particular force-fit components 12 is therefore not overlapped in an annular manner by molded housing 1, but rather is exposed. Inlet components 12 are made of an electrically conductive material (or a semiconductive material, depending on the application) and form electrical contact points 17 in the region of overlap zones 16. A not-shown contacting device, which extends through holes 6 in molded housing 1 to electrical contact points 17, may therefore establish an electrical contact with force-fit components 12 in the region of electrical contact points 17.

Figure 3:
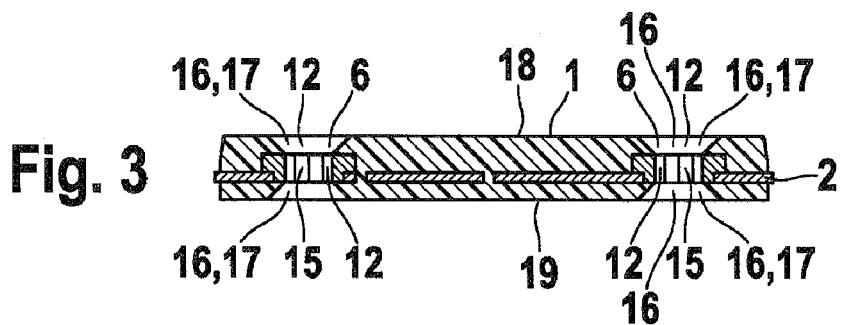
FIG. 3 shows the same die pad, in a cross section.

FIG. 3 shows molded housing 1 in FIG. 2, in a cross section. Molded housing 1 includes holes 6 on both sides (i.e., from top side 18 and from underside 19), which are designed as force-fit zones 7. Holes 6 are designed as truncated cones in sections, i.e., such that hole 6 expands toward top side 18 or underside 19 of molded housing 1. Holes 6 are essentially cylindrical in the region of force-fit components 12 applied to structured die pad 2. Force-fit components 12 include punched-out areas 15, which—due to their smaller cross section relative to holes 6 —form overlap zones 16, which serve as electrical contact points 17.

Figure 4:
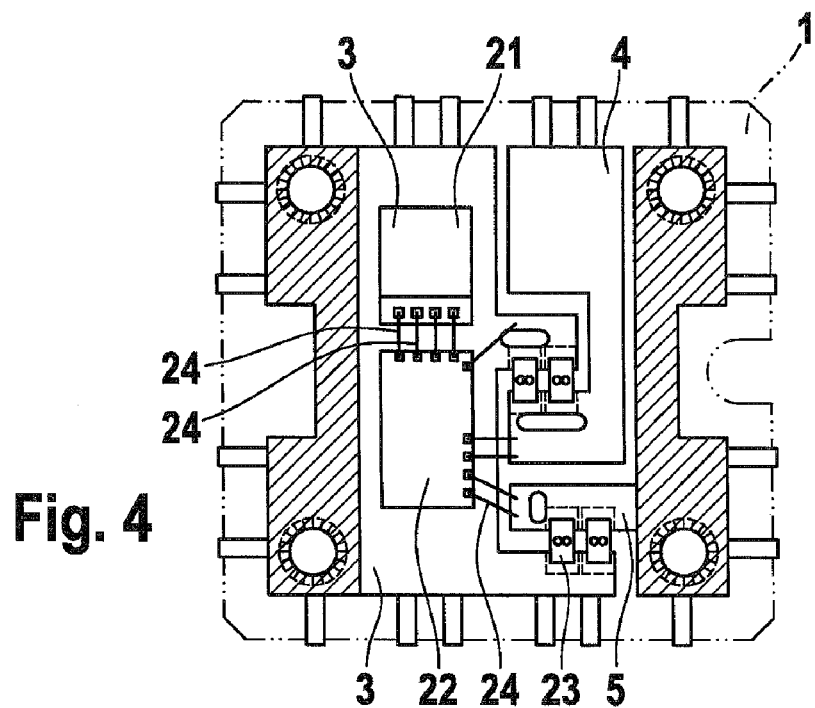
FIG. 4 shows the same die pad, e.g. for a sensor chip with peripheral components.

FIG. 4 shows the same molded housing 1 in a top view. A number of further electronic components, in particular chips and/or capacitors, are located on the first, second, and third die pad components 3, 4, and 5. The present example involves a sensor chip 20 that is designed as an acceleration sensor 21, a further integrated chip 22, and a number of ceramic capacitors. These individual components are connected with the individual die pad components via bonds, using a bonding technique. Bonds 24, which are applied in the conventional manner, are therefore applied between the aforementioned chips or further components.

Figure 5:
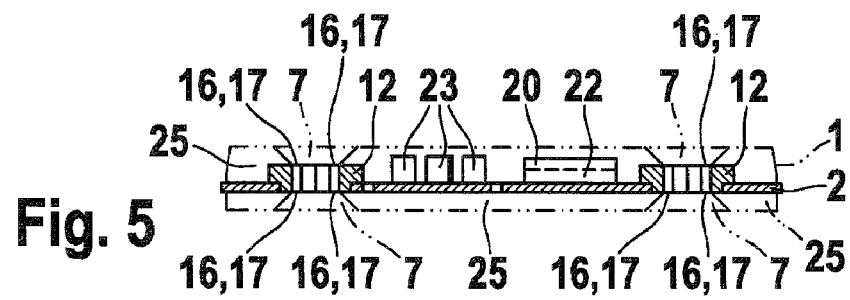
FIG. 5 shows the die pad in FIG. 4, in a cross section.

FIG. 5 shows molded housing 1, as a cross section, with aforementioned ceramic capacitors 23, sensor chip 20, and integrated chip 22. They are enclosed in a mold compound 25, as are structured die pad 2 and force-fit components 12, and are therefore hermetically sealed, with the exception of overlap zones 16, which are formed in the region of force-fit zones 7 and function as electrical contact points 17.

Figure 6:
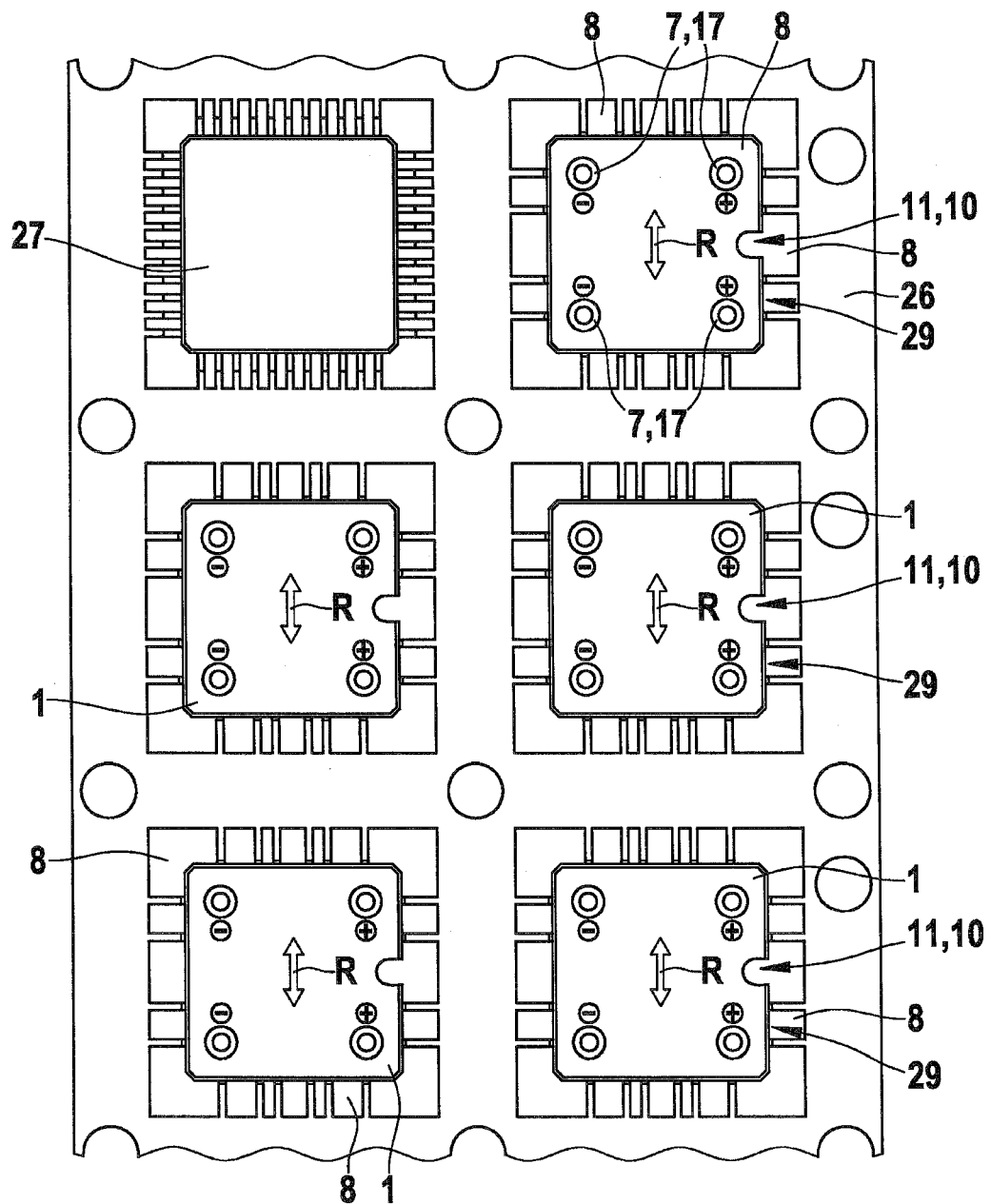
FIG. 6 shows a lead frame before it is punched.

FIG. 6 shows a section of a lead frame 26 in the manufacturing process. The figure shows five inventive mold housings 1 and (upper left), for illustration purposes, a conventional standard Plastic Quad Flat Pack (PQFP) 27. Inventive mold housings 1 are designed as acceleration sensors 28. They include a not-shown acceleration sensor 21, which is described in FIG. 4 and has a sensing direction R. Molded housings 1 are located on lead frame 26 using shortened leads 8. Molded housings 1 include recess 11 in edge region 29 located on the right, recess 11 serving as positioning device 10. Every molded housing 1 also includes four force-fit zones 7, which are designed as electrically redundant contact points 17. Their particular electrical orientation is depicted using the symbols "+" or "−". "Electrical redundance" means that every molded housing—to be used properly—must be contacted with only one contact point of the particular electrical orientation "+" or "−", thereby allowing the user to decide—upon installation in an electrical application—which of the particular electrical contact points 17 he wants to use to contact molded housing 1 and the electrical circuit contained therein. Positioning device 10 serves to ensure proper positioning, e.g., in a not-shown sensor housing that encloses acceleration sensor 28.

Figure 7:
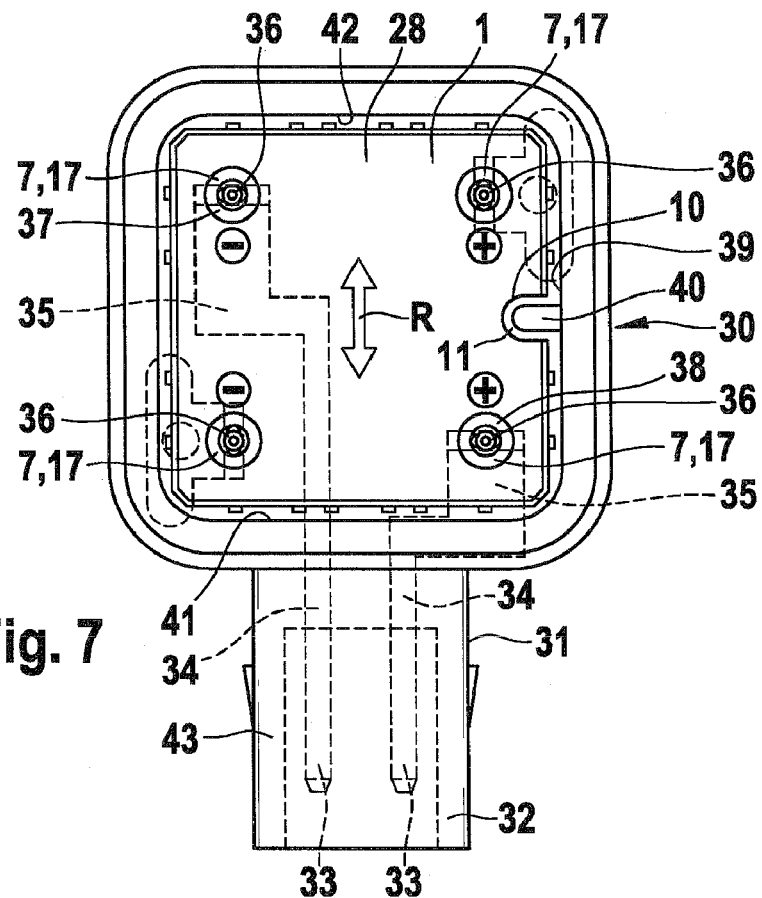
FIG. 7 shows an electronic module as an acceleration sensor for example.

FIG. 7 shows acceleration sensor 28 in FIG. 6 when installed in a sensor housing 30. Sensor housing 30 serves to protect the not-shown electronic components integrated in molded housing 1 of acceleration sensor 28, and the molded housing itself, from disadvantageous external influences. It also serves to simplify handling in terms of a modular design of individual functional components and groups. For this purpose, sensor housing 30 includes a connection region 31, which is essentially designed as a two-poled plug 32. Two-poled plug 32 includes two plug pins 33, which are guided into sensor housing 30 using suitable electrical connections 34, e.g., metallic traces 35, where they are connected with force-fit zone 7 of molded housing 1 using force-fit pins 36. Force-fit zone 7 is designed as redundant electrical contact point 17, and the electrical orientation "+" or "−" applies to only one of the plug pins 33. In the current example, only two force-fit zones 7 or redundant electrical contact points 17 are connected via traces 35 with plug pins 33, i.e., first contact point 37 and second contact point 38. First contact point 37 has a negative orientation in this case, and second contact point 38 has a positive orientation. The two remaining force-fit zones 7 do not serve to provide electrical contacting. Force-fit pins 36 guided through them serve merely to improve the mechanical fixing of molded housing 1 inside sensor housing 30. Molded housing 30 includes a position-determining device 40 on a right inner wall 39, which corresponds to positioning device 10 of molded housing 1. Position-determining device 10 is designed as a projection on right inner wall 39 of sensor housing 30, while positioning device 10 on molded housing 1 is designed as a recess 11. Position-determining device 40 and positioning device 10 essentially correspond with each other with an exact fit, thereby resulting in an exactly-positioned orientation of sensor housing 30 in terms of sensor direction R of acceleration sensor 28. It is now possible—by locating position-determining device 40 in another place in sensor housing 30, i.e., displaced by 90 degrees relative to the position shown, e.g., placed against plug-side inner wall 41 or against inner wall 42, which faces away from the plug—to maintain an exactly-positioned installation of acceleration sensor 28 that is displaced by 90 degrees relative to the installation position shown. Sensing direction R would therefore also differ by 90 degrees from the situation shown. In this manner, an x-sensing and a y-sensing may be realized using the same acceleration sensor 28; there is no need to use two acceleration sensors 28 with different designs. Via redundant electrical contact points 17, i.e., force-fit zones 7 of molded housing 1, proper contacting is also ensured when the installation position is displaced by 90 degrees.

It is also possible, of course, to accommodate two acceleration sensors 28 in a larger sensor housing 30 that is designed for two acceleration sensors 28. By locating position-determining device 40 such that it is displaced by 90 degrees, one sensor senses in the x-direction, and the other senses in the y-direction, i.e., sensing direction R of the two sensors is rotated by 90 degrees relative to each other. At least three plug pins 33 are to be provided, or four. The two plug pins 33, which are also shown in FIG. 7, are provided for each acceleration sensor 28. Acceleration may therefore be sensed in the x-direction and the y-direction within a single sensor housing 30 by using the same acceleration sensor 28. The acceleration sensor that is integrated in this manner is integrated in a single component that is easy to handle and install. The two integrated acceleration sensors 28 are connected via a single plug connection 43.

Figure 8:
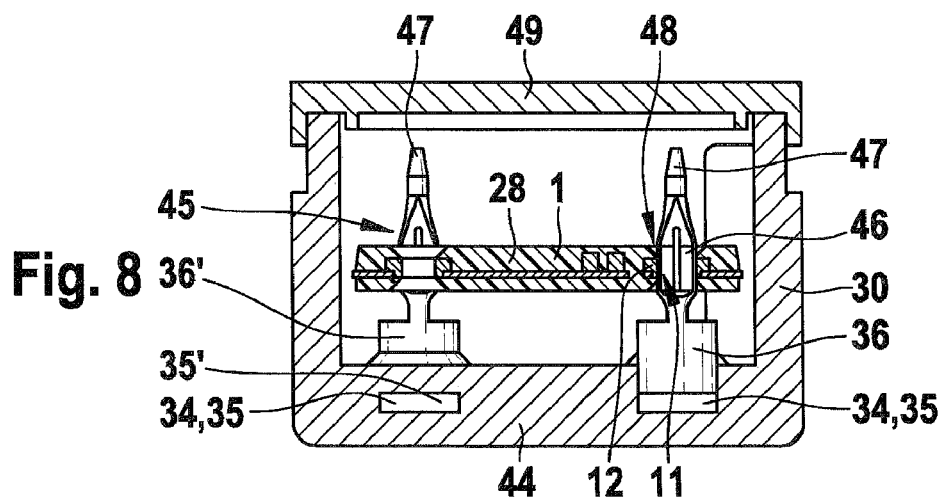
FIG. 8 shows the same electronic module, in a cross section.

FIG. 8 shows a molded housing 1, e.g., above-described acceleration sensor 28, in a sensor housing 30. Electrical connections 34, i.e., traces 35, are injection-molded in a base wall 44, lead to a not-shown, two-poled plug 32, and serve to provide electrical contacting. Force-fit pin 36 shown on the right in the cross section is connected in an electrically conducting manner with traces 35, while force-fit pin 36' shown on the left is not electrically connected with its assigned trace 35'. Force-fit pin 36' on the left serves only to mechanically fix mold housing 1 inside sensor housing 30; it serves merely as a mechanical fastening device 45. The mechanical fixing using mechanical fastening device 45 and the electrical contacting using electrical contact points 17 and force-fit pins 36 is attained by designing force-fit pins 36—at least in sections—as a cylinder 46, and essentially in the shape of a truncated cone on end 47 facing away from printed circuit board 35, to simplify installation. A mechanical fixing and electrical contacting results in the region of electrical contact points 11, i.e., recesses 11 of force-fit components 12, provided that the diameter of cylinder 46 essentially corresponds to the inner diameter of recess 11. Other suitable types of mechanical fixing and contacting are also feasible and suitable, of course. The sole essential aspect is that electrical contacting results, and that a reliable connection that is either purely mechanical or purely electrical results, depending on whether it is designed as a contacting device 48 or a mechanical fastening device 45. Force-fit pins 36 that are designed, e.g., as dowel rods or with spring action in at least one section are also suitable.

Sensor housing 30 is closed with a cover 49, which is welded or bonded in place, for instance. As an alternative or in addition thereto, sensor housing 30 may be filled with a casting compound.

What is claimed is:

1. A molded housing for an electronic circuit, for installation in electronic devices and/or sensors or pick-ups, comprising:
   at least one force-fit zone; and
   a force-fit component assigned to at least one of said at least one force-fit zone, wherein said force-fit component is mounted by welding on a die pad of the molded housing, wherein said force-fit component is a separate, metallic part,
   wherein the force-fit component comprises a punched-out area and the die pad comprises at least one hole, wherein the punched-out area has a smaller cross section than the at least one hole, wherein the punched-out area of the force-fit component and the at least one hole of the die pad are positioned to form an overlap zone, wherein in the region of the overlap zone, a portion of the force-fit component is exposed, and wherein an electrical contact point is formed in the exposed portion of the overlap zone.

2. The molded housing as recited in claim 1, wherein the at least one force-fit zone (7) is designed as electrical contact points (17).

3. The molded housing as recited in claim 1, wherein the at least one force-fit zone (7) is designed as redundant electrical contact points (17).

4. The molded housing as recited in claim 1, wherein the at least one force-fit zone (7) is designed as mechanical fixing devices.

5. The molded housing as recited in claim 1, wherein the at least one force-fit zone (7) has an essentially circular cross section.

6. The molded housing as claim 1, wherein the at least one force-fit zone is designed essentially as recesses (11) in the molded housing (1) that are shaped as truncated cones.

7. The molded housing as recited in claim 1, wherein the molded housing (1) includes a positioning device (10).

8. The molded housing as recited in claim 1, wherein the at least one force-fit zone is located such that they are symmetrical with each other.

9. The molded housing as recited in claim 1, wherein the at least one force-fit zone is located such that they are symmetrical relative to the positioning device (10).

10. The molded housing as recited in claim 1, wherein the contact points (17) may be contacted from the top side (18) and from the bottom side (19) of the molded housing (1).

11. The molded housing as recited in claim 1, wherein the at least one force-fit zone include holes (6).

12. The molded housing as recited in claim 1, wherein the molded housing (1) is a standard molded housing.

13. The molded housing as recited in claim 1, wherein, the die pad (2) includes receiving zones for the force-fit components.

14. The molded housing as recited in claim 1, wherein the die pad (2) includes a receiving structure for orienting and/or fixing the force-fit components in position.

15. An electronic module in the form of an acceleration sensor for automotive technology, comprising:
   a molded housing (1) for an electronic circuit, for installation in electronic devices and/or sensors or pick-ups, comprising at least one force-fit zone; and
   a force-fit component assigned each of said at least one force-fit zone, wherein said force-fit component is mounted by welding on a die pad of the molded housing, and wherein said force-fit component is a separate, metallic part,
   wherein the force-fit component comprises a punched-out area and the die pad comprises at least one hole, wherein the punched-out area has a smaller cross section than the at least one hole, wherein the punched-out area of the force-fit component and the at least one hole of the die pad are positioned to form an overlap zone, wherein in the region of the overlap zone, a portion of the force-fit component is exposed, and wherein an electrical contact point is formed in the exposed portion of the overlap zone.

16. The electronic module as recited in claim 15, wherein the molded housing (1) is electrically contacted in the electronic module that includes a cavity using at least two force-fit pins (36) that correspond to the at least one force-fit zone (7).

17. The electronic module as recited in claim 16, wherein the force-fit pins (36) are designed as a mechanical fastening device (45).

18. The electronic module as recited in claim 1, wherein the electronic module includes force-fit pins (36), which are designed exclusively as a mechanical fastening device (45), but not as a contacting device (48).

19. The electronic module as recited in claim 15, wherein the electronic module includes a position-determining device (40).

20. The molded housing as recited in claim 12, wherein the molded housing (1) is a standard Plastic Quad Flat Pack (PQFP) (27), that includes no or very short leads (8).

* * * * *